United States Patent
Baba

(10) Patent No.: US 11,629,429 B2
(45) Date of Patent: Apr. 18, 2023

(54) QUARTZ GLASS CRUCIBLE AND METHOD FOR PRODUCING THE SAME

(71) Applicant: SHIN-ETSU QUARTZ PRODUCTS CO., LTD., Tokyo (JP)

(72) Inventor: Yuji Baba, Echizen (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 0 days.

(21) Appl. No.: 17/043,484

(22) PCT Filed: Feb. 19, 2019

(86) PCT No.: PCT/JP2019/005945
§ 371 (c)(1),
(2) Date: Sep. 29, 2020

(87) PCT Pub. No.: WO2019/193851
PCT Pub. Date: Oct. 10, 2019

(65) Prior Publication Data
US 2021/0108329 A1    Apr. 15, 2021

(30) Foreign Application Priority Data
Apr. 6, 2018    (JP) .............................. JP2018-073766

(51) Int. Cl.
*C30B 15/10*    (2006.01)
*C03B 19/09*    (2006.01)
(Continued)

(52) U.S. Cl.
CPC ............ *C30B 15/10* (2013.01); *C03B 19/095* (2013.01); *C03B 20/00* (2013.01); *C30B 29/06* (2013.01)

(58) Field of Classification Search
CPC ....... C30B 15/10; C30B 19/095; C30B 20/00; C30B 29/06; C03B 19/095; C03B 20/00
See application file for complete search history.

(56) References Cited

U.S. PATENT DOCUMENTS 5,306,388 A *   4/1994   Nakajima ............. C03B 19/095
                                                  117/208
6,672,107 B2    1/2004   Werdecker et al.
(Continued)

FOREIGN PATENT DOCUMENTS

CN      102575381 A    7/2012
EP      0 319 031 A2   6/1989
(Continued)

OTHER PUBLICATIONS

Oct. 6, 2020 International Preliminary Report on Patentability issued in International Patent Application No. PCT/JP2019/005945.
(Continued)

*Primary Examiner* — Robert M Kunemund
(74) *Attorney, Agent, or Firm* — Oliff PLC

(57) ABSTRACT

A quartz glass crucible including bottom, curved, and straight body portions, where the quartz glass crucible includes an outer layer including opaque quartz glass containing bubbles, and an inner layer including transparent quartz glass, the outer layer fabricated from different types of raw material powder, the outer layer having regions sectioned by bubble content densities, and bubble content densities of two outer layer adjacent regions, when $d_a$ (pcs/mm³) is defined as content density of a region "a" having a greater content density, and $d_b$ (pcs/mm³) is defined as content density of a region "b" having a smaller content density, a difference $D=(d_a-d_b)/d_b$ between content densities of the two regions is 10% or more.

9 Claims, 2 Drawing Sheets

(51) Int. Cl.
*C03B 20/00* (2006.01)
*C30B 29/06* (2006.01)

(56) References Cited

U.S. PATENT DOCUMENTS

| | | | | |
|---|---|---|---|---|
| 7,086,887 | B2* | 8/2006 | Tsai | G06K 13/0862 439/331 |
| 8,277,559 | B2* | 10/2012 | Ohama | C30B 29/06 117/208 |
| 8,789,391 | B2* | 7/2014 | Kayser | C30B 35/002 65/33.9 |
| 9,863,061 | B2* | 1/2018 | Sudo | C30B 29/06 |
| 2008/0141929 | A1 | 6/2008 | Kemmochi et al. | |
| 2010/0251959 | A1 | 10/2010 | Kodama et al. | |
| 2012/0160159 | A1 | 6/2012 | Sudo et al. | |
| 2014/0182510 | A1 | 7/2014 | Yamagata | |

FOREIGN PATENT DOCUMENTS

| | | |
|---|---|---|
| EP | 2 182 099 A1 | 5/2010 |
| JP | H01-148782 A | 6/1989 |
| JP | 2008-169106 A | 7/2008 |
| JP | 2010-105880 A | 5/2010 |
| JP | 2010-155765 A | 7/2010 |
| JP | 2010-241623 A | 10/2010 |
| JP | 2010-275151 A | 12/2010 |
| JP | 2011-73925 A | 4/2011 |
| JP | 2012-116716 A | 6/2012 |
| JP | 2018-39702 A | 3/2018 |
| KR | 2017000548 * | 1/2017 |
| WO | 2011/030657 A1 | 3/2011 |

OTHER PUBLICATIONS

Jul. 5, 2019 International Search Report issued in International Patent Application No. PCT/JP2019/005945.
Aug. 20, 2021 Office Action issued in Chinese Patent Application No. 201980024394.5.
Liu, Xinnian. "Glassware Production Technology". Chemical Industry Press, p. 313, Jan. 31, 2007.
Jan. 11, 2022 Notification of Reasons for Refusal issued in Japanese Patent Application No. 2018-073766.
Jan. 20, 2022 Search Report and Written Opinion issued in Singapore Patent Application No. 11202009222S.
Nov. 15, 2021 Search Report issued in European Patent Application No. 19780872.8.
Apr. 8, 2022 Office Action issued in Chinese Patent Application No. 201980024394.5.
Jun. 21, 2022 Office Action issued in Japanese Patent Application No. 2018-073766.
Jul. 6, 2022 Office Action issued in Chinese Patent Application No. 201980024394.5.
Jun. 2, 2022 Office Action issued in Taiwanese Patent Application No. 108106397.

* cited by examiner

[FIG. 1]
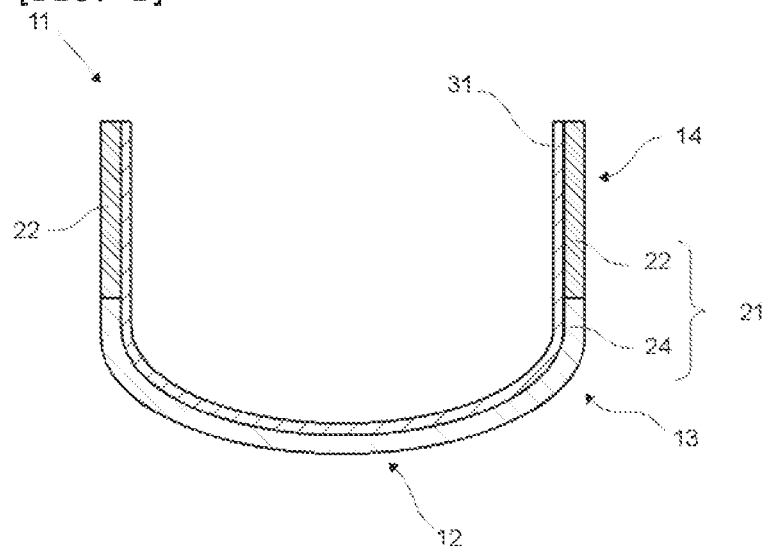
[FIG. 2]
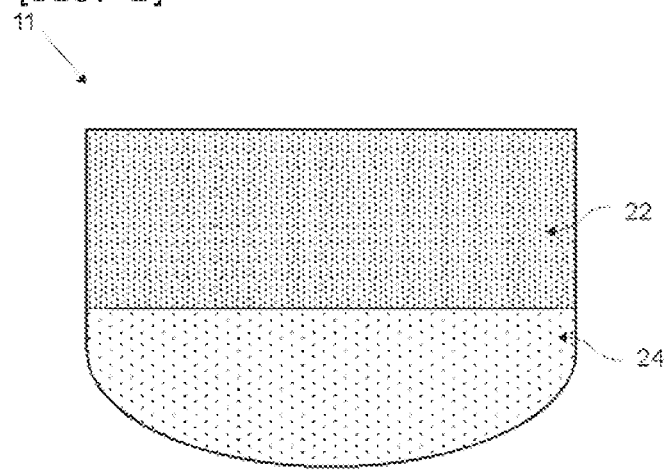

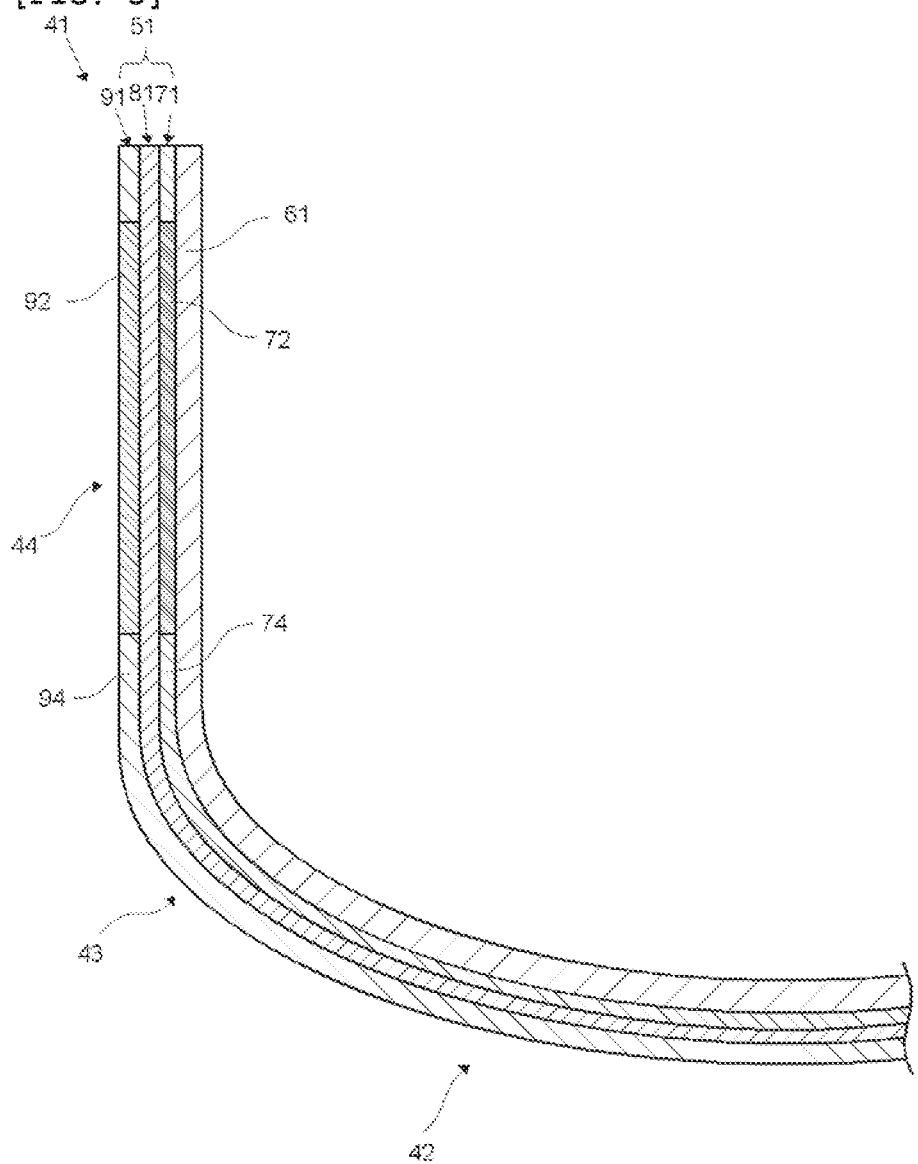

QUARTZ GLASS CRUCIBLE AND METHOD FOR PRODUCING THE SAME

TECHNICAL FIELD

The present invention relates to a quartz glass crucible and a method for producing the same.

BACKGROUND ART

Conventionally, the so called Czochralski method has been widely adopted for producing a single crystal material such as a single crystal semiconductor material. This is a method in which polycrystalline silicon is melted in a container, and an end of a seed crystal is dipped into the melt bath (melt) and is pulled with rotation. In this method, a single crystal grows under the seed crystal with having the same crystal orientation. In pulling of a single crystal silicon, a quartz glass crucible is generally used for the container from which the single crystal is pulled. The quartz glass crucible has an outer layer including an opaque quartz glass containing bubbles therein, and an inner layer including a transparent quartz glass containing substantially no bubbles.

In recent years, with increase in the size of single crystal silicon wafers, increase in the diameter of quartz glass crucibles has also progressed, and it is necessary to deal with the increase in the heat load that works on the quartz glass crucible and the increase in heating time in a single crystal silicon pulling operation. Durability against deformation when heating and durability against degradation that occurs when cooling after heating, etc. are required in a quartz glass crucible, and it is sometimes required to use a raw material powder (raw quartz powder) suitable for each requirement selectively in a necessary portion. For example, Patent Document 1 discloses doping a part of the outer layer with a crystallization promoting agent.

CITATION LIST

Patent Literature

Patent Document 1: Japanese Unexamined Patent Application Publication No. 2010-275151

SUMMARY OF INVENTION

Technical Problem

As described above, it is sometimes required to use different types of raw material powder selectively in necessary portions of a quartz glass crucible. For example, sometimes, a raw material (raw quartz powder) having different characteristics is partially used in an opaque quartz glass layer of a quartz glass crucible, particularly in an outer layer that includes the outer surface, where precision is required in the formation range of the raw material. However, the appearance of the resulting quartz glass crucible is uniformly white, and the boundary between the types of raw material cannot be observed by visual observation. Accordingly, there has been a problem that a quartz glass crucible is used for pulling a single crystal even when a predetermined raw material layer (hereinafter, a layer (region) formed from a predetermined raw material out of the constituents of the quartz glass crucible is sometimes referred to simply as "raw material layer") is not configured in a predetermined range, causing a malfunction. For example, a quartz raw material layer containing an impurity for promoting devitrification can be intentionally formed on the outer surface of a crucible having, as a base, a high-purity quartz raw material with a low impurity concentration in order to improve heat resistance by crystallization of quartz glass. In this case, if the quartz raw material layer containing the impurity is formed on an unnecessary portion, cracks occur due to degradation by devitrification, and a malfunction that silicon melt leaks out occurs.

In addition, even when different types of raw material powder are not used (the same type of raw material powder is used) as a raw material powder for forming an outer layer of a quartz glass crucible, it has sometimes been required for each region of the outer layer to have a different function.

The present invention has been made in view of the above circumstances, and an object thereof is to provide a quartz glass crucible that can be given a different function in each region in the outer layer of the quartz glass crucible. In addition, an object of the present invention is also to provide a method for producing such a quartz glass crucible.

Solution to Problem

The present invention has been made to solve the above problems, and provides a quartz glass crucible comprising a bottom portion, a curved portion, and a straight body portion, wherein the quartz glass crucible includes an outer layer comprising an opaque quartz glass containing bubbles therein, and an inner layer comprising a transparent quartz glass, the outer layer is fabricated from a same type or two or more different types of raw material powder, the outer layer having two or more regions sectioned by content densities of the bubbles, and regarding bubble content densities of two adjacent regions of the outer layer, when $d_a$ (pcs/mm³) is defined as a bubble content density of a region "a" having a greater content density of the bubbles, and $d_b$ (pcs/mm³) is defined as a bubble content density of a region "b" having a smaller content density of the bubbles, a difference $D=(d_a-d_b)/d_b$ between the bubble content densities of the two adjacent regions is 10% or more.

In such a quartz glass crucible, two or more regions can be differentiated by the content densities of the bubbles, and it is possible to impart different functions to two or more regions sectioned by the content densities of the bubbles based on the difference in bubble content densities.

In this case, the outer layer can be fabricated from the two or more different types of raw material powder, and the regions sectioned by the content densities of the bubbles can be each fabricated from the different types of raw material powder.

In such a quartz glass crucible, an outer layer fabricated from particular different types of raw material powder can be sectioned by the content densities of the bubbles.

Furthermore, a boundary where the difference D between the bubble content densities is 10% or more can be located in the straight body portion.

When the boundary where the difference D between the bubble content densities is 10% or more is located in the straight body portion as described, the quartz glass crucible can be given, in the straight body portion, two or more regions differentiated by the content densities of the bubbles.

Furthermore, in the inventive quartz glass crucible, the boundary between the two adjacent regions is preferably visually distinguishable.

Thus, the inventive quartz glass crucible is also favorable in terms of control since the boundary between the two adjacent regions can be visually distinguished.

Furthermore, in the inventive quartz glass crucible, at least a part of the outer layer can have a plurality of sub-layers differentiated by a difference in raw material powder in a thickness direction of the quartz glass crucible.

Thus, at least a part of the outer layer can further include a plurality of sub-layers differentiated by the difference in raw material powder. The present invention can also be applied to a quartz glass crucible having such a configuration.

Furthermore, the quartz glass crucible can be a quartz glass crucible for pulling a single crystal silicon for pulling a single crystal silicon from a silicon melt held in the quartz glass crucible.

Thus, the inventive quartz glass crucible can be used particularly suitably as a quartz glass crucible for pulling a single crystal silicon.

In addition, the present invention provides a method for producing a quartz glass crucible having an outer layer comprising an opaque quartz glass containing bubbles therein, and an inner layer comprising a transparent quartz glass, the quartz glass crucible comprising a bottom portion, a curved portion, and a straight body portion, the method comprising the steps of:

supplying a raw material powder of the outer layer into a rotating mold to form, on an inner surface of the mold, a powder layer to be the outer layer of the quartz glass crucible; and fabricating the outer layer by heat-melting the powder layer, wherein the powder layer is formed using a same type or two or more different types of raw material powder as the raw material powder of the outer layer, when the powder layer is formed, a difference is made in a rotational rate of the mold so that the powder layer is sectioned into two or more regions according to the rotational rate of the mold, and two or more regions sectioned by content densities of the bubbles are fabricated in the outer layer by heat-melting the powder layer sectioned into the two or more regions, wherein regarding bubble content densities of two adjacent regions of the outer layer, when $d_a$ (pcs/mm$^3$) is defined as a bubble content density of a region "a" having a greater content density of the bubbles, and $d_b$ (pcs/mm$^3$) is defined as a bubble content density of a region "b" having a smaller content density of the bubbles, a difference $D=(d_a-d_b)/d_b$ between the bubble content densities of the two adjacent regions is 10% or more.

Such a method for producing a quartz glass crucible makes it possible to form, in an outer layer of the quartz glass crucible to be produced, two or more regions sectioned by the content densities of the bubbles by making a difference in the rotational rate of the mold when forming the powder layer. In this manner, different functions based on the difference in bubble content densities can be imparted to two or more regions sectioned by the content densities of the bubbles.

In this case, the powder layer can be fabricated using the two or more different types of raw material powder, and the two or more regions of the powder layer according to the rotational rate of the mold can each contain the different types of raw material powder so that the regions sectioned by the content densities of the bubbles are each fabricated from the different types of raw material powder.

In a quartz glass crucible produced by such a production method, an outer layer fabricated from particular different types of raw material powder can be sectioned by the content densities of the bubbles.

Furthermore, the rotational rate of the mold is preferably changed in a position corresponding to the straight body portion of the quartz glass crucible.

In this manner, a quartz glass crucible having the boundary where the difference D between the bubble content densities is 10% or more located in the straight body portion can be produced. Consequently, the quartz glass crucible can be given, in the straight body portion of the crucible, two or more regions differentiated by the content densities of the bubbles.

Furthermore, in the present invention, at least a part of the powder layer can be formed to have a plurality of sub-powder-layers differentiated by a difference in raw material powder in a thickness direction.

By forming the powder layer for the outer layer to have such sub-powder-layers, at least a part of the outer layer of the quartz glass crucible to be produced can further include a plurality of sub-layers differentiated by the difference in raw material powder.

Furthermore, the quartz glass crucible can be a quartz glass crucible for pulling a single crystal silicon for pulling a single crystal silicon from a silicon melt held in the quartz glass crucible.

Thus, a quartz glass crucible produced by the inventive production method can be used particularly suitably as a quartz glass crucible for pulling a single crystal silicon.

Advantageous Effects of Invention

In the inventive quartz glass crucible, two or more regions can be differentiated by the content densities of the bubbles, and it is possible to impart different functions to two or more regions sectioned by the content densities of the bubbles based on the difference in bubble content densities. In addition, the inventive method for producing a quartz glass crucible makes it possible to form, in an outer layer of the quartz glass crucible to be produced, two or more regions sectioned by the content densities of the bubbles by a simple method of making a difference in the rotational rate of the mold when forming the powder layer.

BRIEF DESCRIPTION OF DRAWINGS

FIG. 1 is a schematic cross-sectional view of an example of a quartz glass crucible according to the present invention.

FIG. 2 is a schematic front view of an example of a quartz glass crucible according to the present invention.

FIG. 3 is a schematic cross-sectional view of a different example of a quartz glass crucible according to the present invention.

DESCRIPTION OF EMBODIMENTS

As described above, characteristics of a quartz glass crucible can be varied by using multiple types of raw material powder having different characteristics as a raw material powder (raw quartz powder) configuring an opaque quartz glass layer (outer layer) of the quartz glass crucible. Sometimes, a raw material powder having different characteristics is partially used particularly in an outer layer that includes the outer surface, where precision is required in the formation range of the raw material powder. However, there has been a problem that the boundary between the types of raw material cannot be observed by observing the appearance of the resulting quartz glass crucible. To solve this problem, the present inventor has keenly studied and found out that the boundary between the types of raw material can be visually distinguished by varying the content densities of the bubbles in each region having a different raw material, and completed the present invention. In addition, the present inventor has found out that such a quartz glass crucible having regions differentiated by the content densities of the bubbles can also be applied when the same type of raw material powder is used.

Hereinafter, the present invention will be more specifically described with reference to the drawings.

FIG. 1 shows a schematic cross-sectional view of an example of a quartz glass crucible according to the present invention. FIG. 2 shows a schematic front view of an example of a quartz glass crucible according to the present invention.

As shown in FIG. 1, the inventive quartz glass crucible 11 includes a bottom portion 12, a curved portion 13, and a straight body portion 14. The straight body portion 14 refers to a portion of a substantially cylindrical shape in a crucible shape. A region between the straight body portion 14 and the bottom portion 12 is referred to as the curved portion 13. The bottom portion 12 of the crucible can be defined, for example, as a portion having a diameter of approximately two-thirds or less of the outer diameter of the crucible. The height of the straight body portion 14 can be defined, for example, as the upper-four-third portion of the height of the crucible, although it depends on the shape of the crucible.

In addition, the quartz glass crucible 11 has an outer layer 21 including an opaque quartz glass containing bubbles therein, and an inner layer 31 including a transparent quartz glass. The inner layer 31 is a portion that looks transparent since substantially no bubbles are contained. Furthermore, the outer layer 21 of the inventive quartz glass crucible 11 is fabricated from the same type or two or more different types of raw material powder, the outer layer having two or more regions sectioned by the content densities of the bubbles. In FIGS. 1 and 2, a first region 22 and a second region 24 sectioned by the content densities of the bubbles are shown as an example. Furthermore, in the inventive quartz glass crucible 11, regarding bubble content densities of two adjacent regions of the outer layer 21, when $d_a$ (pcs/mm$^3$) is defined as a bubble content density of a region "a" having a greater content density of the bubbles, and $d_b$ (pcs/mm$^3$) is defined as a bubble content density of a region "b" having a smaller content density of the bubbles, a difference $D=(d_a-d_b)/d_b$ between the bubble content densities of the two adjacent regions is 10% or more.

The difference D between the bubble content densities will be explained with the first region 22 and the second region 24 shown in FIGS. 1 and 2 as an example. Here, suppose the first region 22 is a region having a greater bubble content density than the second region 24. Meanwhile, suppose the second region 24 is a region having a smaller bubble content density than the first region 22. In this case, out of the two adjacent regions, the first region 22 corresponds to the region "a" having the greater content density of the bubbles, and the bubble content density thereof is $d_a$ (pcs/mm$^3$). On the other hand, the second region 24 corresponds to the region "b" having the smaller content density of the bubbles in this case, and the bubble content density thereof is $d_b$ (pcs/mm$^3$). In this event, the difference between the bubble content densities of the adjacent first region 22 and second region 24 is defined as $D=(d_a-d_b)/d_b$. In the present invention, this difference D between the bubble content densities is set to be 10% or more.

The bubble content density in each region of the quartz glass crucible 11 is expressed by the number of bubbles per unit volume of 1 mm$^3$. The bubble content densities can be measured as follows, for example. Firstly, a sample is cut out of a region to measure the bubble content density of, and is processed to have a thickness of approximately 1 mm. Next, the bubbles are observed using an optical microscope at a magnifying power of 30. In this event, the number of bubbles that are present within an area of 5.5 mm$^2$ is measured. Taking the thickness of the sample (approximately 1 mm) into consideration, the number of bubbles per unit volume, that is, the bubble content density [pcs/mm$^3$] is calculated.

In the example of FIG. 1 and FIG. 2, a case where there are two regions having different bubble content densities in the outer layer 21 is shown, but there may be three or more regions sectioned by the content densities of the bubbles. In that case, it is sufficient to have one or more combinations of two adjacent regions that satisfy the relation that the difference D between the bubble content densities thereof is 10% or more.

The inventive quartz glass crucible 11 can be used particularly suitably as a quartz glass crucible for pulling a single crystal silicon for pulling a single crystal silicon from a silicon melt held in the quartz glass crucible 11.

In the inventive quartz glass crucible 11, two or more regions can be differentiated by the content densities of the bubbles, and it is possible to impart different functions to two or more regions sectioned by the content densities of the bubbles based on the difference in bubble content densities. For example, in the case of a quartz glass crucible for pulling a single crystal silicon, it is sometimes necessary to adjust infrared transmittance from requirements of the quality (density of oxygen contained in the crystal, etc.) of the crystal to be pulled, etc. In the present invention, infrared transmittance can be adjusted based on the difference in bubble content densities according to the region of the quartz glass crucible outer layer.

Furthermore, in the inventive quartz glass crucible 11, the boundary where the difference D between the bubble content densities is 10% or more is preferably located in the straight body portion of the quartz glass crucible 11 as shown in FIGS. 1 and 2. Consequently, the quartz glass crucible 11 can be given, in the straight body portion, two or more regions differentiated by the content densities of the bubbles.

In particular, the outer layer 21 of the inventive quartz glass crucible 11 can be fabricated from two or more different types of raw material powder. In this case, the regions sectioned by the content densities of the bubbles can be each fabricated from the different types of raw material powder. In this manner, the regions fabricated from the different types of raw material powder can be visually differentiated by the content densities of the bubbles even in a quartz glass crucible state. Note that the differentiation by visual observation in this event is possible not only when seen from the outer layer side of the crucible, but also when seen from the inner layer side in the present invention. This is because the inner layer includes a transparent quartz glass. The visual differentiation based on the bubble content densities can be performed clearly when the difference D between the bubble content densities of the two adjacent regions is 10% or more. Furthermore, this is not limited to cases where different types of raw material powder are used, and visual differentiation by the boundary line between the two regions is also possible when the same type of raw material powder is used if the difference D between the bubble content densities is 10% or more. That is, when the difference D between the bubble content densities of the two adjacent regions is 10% or more, a difference of shade in appearance occurs in the boundary position, and the boundary line can be visually observed.

Furthermore, the present invention can be formed so that at least a part of the outer layer has a plurality of sub-layers differentiated by a difference in raw material powder in a thickness direction of the quartz glass crucible. FIG. 3 shows a schematic cross-sectional view of an example of a different embodiment of the quartz glass crucible according to the present invention. The quartz glass crucible 41 shown in FIG. 3 includes a bottom portion 42, a curved portion 43, and a straight body portion 44, and has an outer layer 51 including an opaque quartz glass containing bubbles therein, and an inner layer 61 including a transparent quartz glass in the same manner as the quartz glass crucible 11 shown in FIG. 1. FIG. 3 shows an example where the outer layer 51 has three sub-layers 71, 81, and 91 differentiated by the difference in raw material powder. The three sub-layers 71, 81, and 91 are formed, for example, from raw material powders each having a different contaminant or type and content of dopant, etc. Furthermore, in the embodiment of FIG. 3, at least one sub-layer has two or more regions sectioned by the content densities of the bubbles, where the difference D between the bubble content densities is 10% or more. In this manner, the difference D between the bubble content densities of two adjacent regions in the outer layer 51 can be made to be 10% or more.

FIG. 3 shows an example where, out of the sub-layers 71, 81, and 91 of the outer layer, the innermost sub-layer 71 and the outermost sub-layer 91 each have a region sectioned by the content densities of the bubbles. In the innermost sub-layer 71, the difference D between the bubble content densities of the first region 72 and the second region 74 is 10% or more. Likewise, in the outermost sub-layer 91, the difference D between the bubble content densities of the first region 92 and the second region 94 is 10% or more. In this manner, multiple regions in a vertical (height) direction of the quartz glass crucible 41 can be differentiated by the amount of the bubble content densities in each of the innermost sub-layer 71 and the outermost sub-layer 91.

In addition, when there is a difference in the bubble content densities in the vertical direction in the innermost sub-layer 71 and the difference D is 10% or more as shown in FIG. 3, the boundary portion in the sub-layer 71 can be visually discerned from the inner layer 61 side of the quartz glass crucible 41. On the other hand, when there is a difference in the bubble content densities in the vertical direction in the outermost sub-layer 91 and the difference D is 10% or more, the boundary portion in the sub-layer 91 can be visually discerned from outside the outer layer 51 of the quartz glass crucible 41.

The present invention can be applied particularly favorably when different types of raw material powder are used in the end face side and the bottom portion side in the straight body portion of the quartz glass crucible 11. A raw material powder for high durability against deformation by heat, and a raw material powder for high durability against degradation that occurs when cooling after heating, etc. are sometimes used selectively, and the position of the boundary line thereof varies depending on conditions of the single crystal silicon ingot pulling operation. FIGS. 1 and 2 show an example where the first region 22 is the straight body portion from the end face (upper end) of the crucible to a predetermined range, and for example, the raw material powder (raw material powder A) of this first region 22 can be a raw material powder containing an impurity such as a crystallization promoting agent. In addition, the raw material powder (raw material powder B) of the second region 24 can be a raw material powder that does not contain an impurity such as a crystallization promoting agent. The present invention can also be applied to other embodiments. For example, the present invention can be applied in a case where only the middle of the straight body portion not including the end face is an impurity-containing layer, or a case where a layer of a different type of raw material is provided only in the curved portion (small curved portion). In this case, a difference can be made in the bubble density of the impurity-containing layer and the content densities of the bubbles in the layer that does not contain an impurity.

The inventive quartz glass crucible 11 with a difference made in the bubble content densities as described above can be produced by a method of making a difference in the rotational rate of the mold when forming each raw material powder (raw quartz powder) in a rotating mold. Since a difference occurs in the centrifugal force working on the powder layer (raw material powder compact) according to the rotational rate of the mold, the density of the powder layer (raw material powder compact) can be adjusted by adjusting the rotational rate of the mold. In this manner, a difference in bubble content densities can be made between each region in the outer layer 21 of the quartz glass crucible 11 obtained after heat-melting (arc melting) the powder layer. However, on application of the present invention, the adjustment is not limited to only the adjustment of the rotational rate of the mold. For example, the bubble content densities can be adjusted by adjusting the particle size of the raw material powder.

A method for making a difference in the rotational rate of the mold is, specifically, the following method. Firstly, a raw material powder of the outer layer is supplied into a rotating mold to form, on an inner surface of the mold, a powder layer to be the outer layer of the quartz glass crucible (step "a"). Next, the outer layer is fabricated by heat-melting the powder layer (step "b"). A known arc melting can be used for the heat-melting. Here, in step "a" of the inventive method for producing a quartz glass crucible, the powder layer is formed using the same type or two or more different types of raw material powder as the raw material powder of the outer layer. Furthermore, in step "a", when the powder layer is formed, a difference is made in the rotational rate of the mold so that the powder layer is sectioned into two or more regions according to the rotational rate of the mold. Two or more regions (the first region 22 and the second region 24 in FIGS. 1 and 2) sectioned by the content densities of the bubbles are fabricated in the outer layer 21 by heat-melting the powder layer sectioned into the two or more regions. By such a production method, it is possible to produce a quartz glass crucible 11 where regarding the bubble content densities of two adjacent regions of the outer layer 21, when $d_a$ (pcs/mm$^3$) is defined as a bubble content density of a region "a" having a greater content density of the bubbles, and $d_b$ (pcs/mm$^3$) is defined as a bubble content density of a region "b" having a smaller content density of the bubbles, a difference $D=(d_a-d_b)/d_b$ between the bubble content densities of the two adjacent regions is 10% or more.

The inner layer 31 of the quartz glass crucible 11 shown in FIG. 1 can be fabricated by a known method. For example, the inner layer 31 can be fabricated by arc melting while supplying a raw material powder for the inner layer to the inside of the outer layer 21 after forming the outer layer 21. The inner layer 31 can also be formed by making the inner surface side of the powder layer formed from the raw material powder for the outer layer transparent by arc melting.

Such a method for producing a quartz glass crucible makes it possible to differentiate, by the content densities of the bubbles, two or more regions in the outer layer of the quartz glass crucible to be produced sectioned by the content densities of the bubbles by making a difference in the rotational rate of the mold when forming the powder layer. In this manner, different functions based on the difference in bubble content densities can be imparted to two or more regions sectioned by the content densities of the bubbles.

Furthermore, when the powder layer is fabricated using two or more different types of raw material powder, it is particularly preferable for the two or more regions of the powder layer according to the rotational rate of the mold to each contain the different types of raw material powder. In this manner, each of the regions sectioned by the content densities of the bubbles can be fabricated from a different raw material powder.

Conventionally, a quartz glass crucible obtained by heating a raw material powder formed in a rotating mold from the inside is uniformly white in appearance, and the boundary between the types of raw material cannot be observed. However, when the difference D between the bubble content densities (pcs/mm$^3$) of adjacent regions in the outer layer 21 is 10% or more as in the inventive quartz glass crucible 11, a difference of shade in appearance occurs, and the boundary with a layer of a different raw material can be visually observed.

Furthermore, by changing the rotational rate of the mold in a position corresponding to the straight body portion of the quartz glass crucible, a quartz glass crucible having the boundary where the difference D between the bubble content densities is 10% or more located in the straight body portion can be produced. Consequently, the quartz glass crucible can be given, in the straight body portion of the crucible, two or more regions differentiated by the content densities of the bubbles.

Furthermore, when the quartz glass crucible 41 shown in FIG. 3 is produced, the quartz glass crucible 41 is produced by forming at least a part of the powder layer to have a plurality of sub-powder-layers differentiated by a difference in raw material powder in a thickness direction, and otherwise producing in the same manner as described above.

EXAMPLE

Hereinafter, the present invention will be described more specifically with reference to Examples of the present invention and Comparative Examples, but the present invention is not limited to these Examples, and there is no doubt that various modifications can be carried out unless deviating from the technical concept of the present invention.

Example 1

A quartz glass crucible 11 as shown in FIGS. 1 and 2 was produced. Note that as the raw material powder (raw quartz powder) for the outer layer 21, the following two different types of raw material powder (raw material powder A and raw material powder B) were used.

Raw material powder A: Al-content concentration of 50 ppm. Particle size was 50 to 500 μm, mostly 100 to 300 μm.

Raw material powder B: Al-content concentration of 8 ppm. Particle size was 50 to 500 μm, mostly 100 to 300 μm.

The raw material powder A having a particle size of 50 to 500 μm was supplied into a mold with an inner diameter of 570 mm rotating at a rotational rate of 120 rpm for formation at the end face side from a middle line of the straight body portion of the quartz glass crucible. Next, the rotational rate of the mold was changed to 70 rpm, and the raw material powder B having a particle size of 50 to 500 μm was introduced. Thus, formation of a powder layer to be the outer layer 21 of the quartz glass crucible 11 was completed. That is, when the powder layer was formed, a difference was made in the rotational rate of the mold to section the powder layer into two or more regions according to the rotational rate of the mold. This corresponds to using different types of raw material powder as the raw material powder and changing the rotational rate of the mold with each raw material powder. Next, the powder layer (compact) was heat-melted from the inside by arc discharge and cooled to obtain a quartz glass crucible 11 having a diameter of 555 to 560 mm. That is, out of the outer layer 21 in FIGS. 1 and 2, the first region 22 was formed from the raw material powder A, and out of the outer layer 21 in FIGS. 1 and 2, the second region 24 was formed from the raw material powder B.

When the appearance of the quartz glass crucible 11 produced as described above was visually observed at an illuminance of 500 lux or more, it was observed that a clear boundary line had occurred in the border between a raw material layer A (that is, the region formed from the raw material powder A, corresponding to the first region 22) and a raw material layer B (that is, the region formed from the raw material powder B, corresponding to the second region 24). Note that the visual observation in this event was conducted from the outer layer side of the crucible. When the densities of the contained bubbles in the raw material layer A and the raw material layer B were measured, the densities were 63 pcs/mm$^3$ in the raw material layer A, and 43 pcs/mm$^3$ in the raw material layer B. In this case, the raw material layer A is the region "a" with the greater content density of the bubbles, and the bubble content density $d_a$ is 63 pcs/mm$^3$. On the other hand, the raw material layer B is the region "b" with the smaller content density of the bubbles, and the bubble content density $d_b$ is 43 pcs/mm$^3$. Therefore, the difference $D=(d_a-d_b)/d_b$ between the bubble content densities is $(63-43)/43=0.465$, that is, 46.5%. In addition, when the impurity concentration of each region was measured, each showed the characteristics of the impurity concentration of the raw material powder A and the raw material powder B respectively, and it was confirmed that the raw material layers A and B were separated at the boundary line.

Example 2

A quartz glass crucible 11 was fabricated with the rotational rate of the mold when forming the raw material powder A changed to 110 rpm compared with Example 1. When the appearance of this quartz glass crucible 11 was visually observed in the same manner as in Example 1, it was observed that a clear boundary line had occurred in the border between the raw material layer A and the raw material layer B. When the densities of the contained bubbles in the raw material layer A and the raw material layer B were measured, the densities were 59 pcs/mm$^3$ in the raw material layer A, and 43 pcs/mm$^3$ in the raw material layer B, and as the difference D between the bubble content densities, a difference by 37.2% had occurred.

Example 3

A quartz glass crucible 11 was fabricated with the rotational rate of the mold when forming the raw material powder A changed to 110 rpm, and the rotational rate of the mold when forming the raw material powder B changed to 90 rpm compared with Example 1. When the appearance of this quartz glass crucible 11 was visually observed in the same manner as in Example 1, it was observed that a clear boundary line had occurred in the border between the raw material layer A and the raw material layer B. When the densities of the contained bubbles in the raw material layer A and the raw material layer B were measured, the densities were 57 pcs/mm$^3$ in the raw material layer A, and 49 pcs/mm$^3$ in the raw material layer B, and as the difference D between the bubble content densities, a difference by 16.3% had occurred.

Example 4

A quartz glass crucible 11 was fabricated with the rotational rate of the mold when forming the raw material powder A changed to 110 rpm, and the rotational rate of the mold when forming the raw material powder B changed to 95 rpm compared with Example 1. When the appearance of this quartz glass crucible was visually observed in the same manner as in Example 1, it was observed that a clear boundary line had occurred in the border between the raw material layer A and the raw material layer B. When the densities of the contained bubbles in the raw material layer A and the raw material layer B were measured, the densities were 59 pcs/mm$^3$ in the raw material layer A, and 53 pcs/mm$^3$ in the raw material layer B, and as the difference D between the bubble content densities, a difference by 11.3% had occurred.

Comparative Example 1

A quartz glass crucible was fabricated with the rotational rate of the mold when forming the raw material powder B changed to 120 rpm compared with Example 1. When the appearance of this quartz glass crucible was visually observed in the same manner as in Example 1, it was not possible to observe a boundary line in the border between the raw material layer A and the raw material layer B. When the densities of the contained bubbles in the raw material layer A and the raw material layer B were measured, the densities were 63 pcs/mm$^3$ in the raw material layer A, and 63 pcs/mm$^3$ in the raw material layer B, and as the difference D between the bubble content densities, the difference was by 0%, and so the reason can be considered to be that there was no difference between the bubble content densities of the raw material layer A and the raw material layer B.

Comparative Example 2

A quartz glass crucible was fabricated with the rotational rate of the mold when forming the raw material powder A changed to 90 rpm, and the rotational rate of the mold when forming the raw material powder B changed to 90 rpm compared with Example 1. When the appearance of this quartz glass crucible was visually observed in the same manner as in Example 1, it was not possible to observe a boundary line in the border between the raw material layer A and the raw material layer B. When the densities of the contained bubbles in the raw material layer A and the raw material layer B were measured, the densities were 50 pcs/mm$^3$ in the raw material layer A, and 49 pcs/mm$^3$ in the raw material layer B, and as the difference D between the bubble content densities, the difference was by 2.0%, and so the reason can be considered to be that there was little difference between the bubble content densities of the raw material layer A and the raw material layer B.

Comparative Example 3

A quartz glass crucible was fabricated with the rotational rate of the mold when forming the raw material powder B changed to 110 rpm compared with Example 1. When the appearance of this quartz glass crucible was visually observed in the same manner as in Example 1, a boundary line was observed in the border between the raw material layer A and the raw material layer B, but was in an unclear state compared with Example 1. When the densities of the contained bubbles in the raw material layer A and the raw material layer B were measured, the densities were 63 pcs/mm$^3$ in the raw material layer A, and 58 pcs/mm$^3$ in the raw material layer B, and as the difference D between the bubble content densities, the difference was by 8.6%, and so the reason can be considered to be that the difference between the bubble content densities of the raw material layer A and the raw material layer B was smaller.

Comparative Example 4

A quartz glass crucible was fabricated with the rotational rate of the mold when forming the raw material powder A changed to 70 rpm, and the rotational rate of the mold when forming the raw material powder B changed to 60 rpm compared with Example 1. When the appearance of this quartz glass crucible was visually observed in the same manner as in Example 1, a boundary line was observed in the border between the raw material layer A and the raw material layer B, but was in an unclear state compared with Example 1. When the densities of the contained bubbles in the raw material layer A and the raw material layer B were measured, the densities were 45 pcs/mm$^3$ in the raw material layer A, and 41 pcs/mm$^3$ in the raw material layer B, and as the difference D between the bubble content densities, the difference was by 9.8%, and so the reason can be considered to be that the difference between the bubble content densities of the raw material layer A and the raw material layer B was smaller.

The rotational rate of the mold when forming the raw material powder, the bubble content of the base layer (outer layer) of the obtained quartz glass crucible, and the visual observation results of the boundary line of Examples 1 to 4 and Comparative Examples 1 to 4 have been summarized in Table 1. In the table, "Favorable" indicates that the boundary line was visually observed distinctly and the result was extremely favorable, "Somewhat poor" indicates that the boundary line was observed but was unclear and the result was therefore somewhat poor, and "Poor" indicates that it was not possible to visually observe the boundary line and the result was poor.

TABLE 1

| | Rotational rate of mold [rpm] | | Measurement results of bubble content densities | | | |
|---|---|---|---|---|---|---|
| | | | Bubble content densities (density in number) [pcs/mm³] | | Difference D in bubble content densities $(d_a - d_b)/d_b$ [%] | Visual observation of boundary line |
| | Raw material powder A | Raw material powder B | Raw material layer A (first region) | Raw material layer B (second region) | | |
| Example 1 | 120 | 70 | 63 | 43 | 46.5 | Favorable |
| Example 2 | 110 | 70 | 59 | 43 | 37.2 | Favorable |
| Example 3 | 110 | 90 | 57 | 49 | 16.3 | Favorable |
| Example 4 | 110 | 95 | 59 | 53 | 11.3 | Favorable |
| Comparative Example 1 | 120 | 120 | 63 | 63 | 0.0 | Poor |
| Comparative Example 2 | 90 | 90 | 50 | 49 | 2.0 | Poor |
| Comparative Example 3 | 120 | 110 | 63 | 58 | 8.6 | Somewhat poor |
| Comparative Example 4 | 70 | 60 | 45 | 41 | 9.8 | Somewhat poor |

From the results of Examples 1 to 4 and Comparative Examples 1 to 4, it was made clear that when a difference is made in the rotational rate of the mold when forming a quartz raw material powder, a difference occurs in the bubble content densities of the obtained quartz glass crucible, and the boundary line in the raw material layer can be observed on visual observation of the appearance. It was revealed that when the difference D between the bubble content densities is 10% or more, in particular, the boundary line can be visually observed with certainty.

It should be noted that the present invention is not limited to the above-described embodiments. The embodiments are just examples, and any examples which have substantially the same feature and demonstrate the same functions and effects as those in the technical concept disclosed in claims of the present invention are included in the technical scope of the present invention.

The invention claimed is:

1. A method for producing a quartz glass crucible having an outer layer comprising an opaque quartz glass containing bubbles therein, and an inner layer comprising a transparent quartz glass, the quartz glass crucible comprising (i) a bottom portion, (ii) a straight body portion having a substantially cylindrical shape, and (iii) a curved portion between the straight body portion and the bottom portion, the method comprising the steps of:

supplying a raw material powder of the outer layer into a rotating mold to form, on an inner surface of the mold, a powder layer to be the outer layer of the quartz glass crucible; and fabricating the outer layer by heat-melting the powder layer, wherein the powder layer is formed using a same type or two or more different types of raw material powder as the raw material powder of the outer layer, when the powder layer is formed, a difference is made in a rotational rate of the mold so that the powder layer is sectioned into two or more regions according to the rotational rate of the mold, two or more regions sectioned by content densities of the bubbles are fabricated in the outer layer by heat-melting the powder layer sectioned into the two or more regions, wherein regarding bubble content densities of two adjacent regions of the outer layer, when $d_a$ (pcs/mm³) is defined as a bubble content density of a region "a" having a greater content density of the bubbles, and $d_b$ (pcs/mm³) is defined as a bubble content density of a region "b" having a smaller content density of the bubbles, a difference $D=(d_a-d_b)/d_b$ between the bubble content densities of the two adjacent regions is 10% or more, and the rotational rate of the mold is changed in a position corresponding to the straight body portion of the quartz glass crucible so that a boundary where the difference D between the bubble content densities is 10% or more is located in the straight body portion.

2. The method for producing a quartz glass crucible according to claim 1, wherein the powder layer is fabricated using the two or more different types of raw material powder, and the two or more regions of the powder layer according to the rotational rate of the mold each contains the different types of raw material powder so that the regions sectioned by the content densities of the bubbles are each fabricated from the different types of raw material powder.

3. The method for producing a quartz glass crucible according to claim 1, wherein at least a part of the powder layer is formed to have a plurality of sub-powder-layers differentiated by a difference in raw material powder in a thickness direction.

4. The method for producing a quartz glass crucible according to claim 2, wherein at least a part of the powder layer is formed to have a plurality of sub-powder-layers differentiated by a difference in raw material powder in a thickness direction.

5. The method for producing a quartz glass crucible according to claim 1, wherein the quartz glass crucible is a quartz glass crucible for pulling a single crystal silicon for pulling a single crystal silicon from a silicon melt held in the quartz glass crucible.

6. The method for producing a quartz glass crucible according to claim 2, wherein the quartz glass crucible is a quartz glass crucible for pulling a single crystal silicon for pulling a single crystal silicon from a silicon melt held in the quartz glass crucible.

7. The method for producing a quartz glass crucible according to claim 1, wherein when the powder layer is formed, the difference in the rotational rate of the mold is made so that the difference D between the bubble content densities of the two adjacent regions is 16.3% or more.

8. The method for producing a quartz glass crucible according to claim 1, wherein when the powder layer is formed, the difference in the rotational rate of the mold is made so that the difference D between the bubble content densities of the two adjacent regions is 37.2% or more.

9. The method for producing a quartz glass crucible according to claim 1, wherein when the powder layer is formed, the difference in the rotational rate of the mold is made so that the difference D between the bubble content densities of the two adjacent regions is 46.5% or more.

* * * * *